United States Patent
Kim et al.

(10) Patent No.: US 11,919,125 B2
(45) Date of Patent: Mar. 5, 2024

(54) CARRIER WAFERS AND METHODS OF FORMING CARRIER WAFERS

(71) Applicant: CORNING INCORPORATED, Corning, NY (US)

(72) Inventors: Lance Changyong Kim, Corning, NY (US); Fei Lu, Shanghai (CN); Xu Ouyang, Painted Post, NY (US); Yeguang Pan, Camas, WA (US)

(73) Assignee: Corning Incorporated, Corning, NY (US)

(*) Notice: Subject to any disclaimer, the term of this patent is extended or adjusted under 35 U.S.C. 154(b) by 488 days.

(21) Appl. No.: 16/583,696

(22) Filed: Sep. 26, 2019

(65) Prior Publication Data

US 2020/0101577 A1  Apr. 2, 2020

(30) Foreign Application Priority Data

Sep. 29, 2018 (CN) .......................... 201811147777.5

(51) Int. Cl.
*B24B 37/30* (2012.01)
*B24B 37/20* (2012.01)
*H01L 21/683* (2006.01)

(52) U.S. Cl.
CPC .............. *B24B 37/30* (2013.01); *B24B 37/20* (2013.01); *H01L 21/6835* (2013.01)

(58) Field of Classification Search
CPC ......... B24B 37/30; B24B 37/20; B24B 37/08; H01L 21/6835
USPC .................................. 451/285, 41, 287, 394
See application file for complete search history.

(56) References Cited

U.S. PATENT DOCUMENTS

| | | | |
|---|---|---|---|
| 5,968,849 A * | 10/1999 | Bello | H01L 21/02024 216/99 |
| 6,004,860 A | 12/1999 | Ogawa et al. | |
| 7,902,039 B2 | 3/2011 | Tomita et al. | |
| 9,108,289 B2 * | 8/2015 | Furukawa | B24B 49/12 |

(Continued)

FOREIGN PATENT DOCUMENTS

| CN | 1868674 A | 11/2006 |
|---|---|---|
| CN | 201140358 Y | 10/2008 |

(Continued)

OTHER PUBLICATIONS

Machine Generated English Translation of JPH8274050, Published on Oct. 18, 1996, 5 pages. (JPH8274050 submitted with the IDS of Jan. 24, 2020) (Year: 1996).*

(Continued)

*Primary Examiner* — Joel D Crandall
*Assistant Examiner* — Shantese L McDonald
(74) *Attorney, Agent, or Firm* — Amy T. Lang (57) ABSTRACT

A method of forming a carrier wafer includes the steps of: lapping a first surface and a second surface of the carrier wafer such that the carrier wafer is substantially flat, the carrier wafer comprising a glass, glass-ceramic or ceramic material, wherein the carrier wafer has a diameter of from 250 mm to 450 mm and a thickness of from 0.5 mm to 2 mm after lapping; and polishing the first surface of the carrier wafer with at least one of a differential pressure, a differential speed or a differential time between a center portion and an edge portion of the carrier wafer such that the first surface has a convex or concave shape.

18 Claims, 3 Drawing Sheets

(56) References Cited

U.S. PATENT DOCUMENTS

| | | | |
|---|---|---|---|
| 2001/0000497 A1 | 4/2001 | Epshteyn et al. | |
| 2005/0186887 A1* | 8/2005 | Nomura | B24B 49/02 451/5 |
| 2008/0132032 A1 | 6/2008 | Tomita et al. | |
| 2010/0099337 A1* | 4/2010 | Kerstan | B24B 37/08 451/158 |
| 2010/0136884 A1 | 6/2010 | Oh et al. | |
| 2010/0227532 A1 | 9/2010 | Ishibashi et al. | |
| 2012/0190276 A1 | 7/2012 | Shao | |
| 2016/0074988 A1 | 3/2016 | Yamaguchi et al. | |
| 2016/0118073 A1* | 4/2016 | Tawara | C03C 23/00 451/41 |
| 2016/0217998 A1* | 7/2016 | Hashimoto | H01L 21/02013 |
| 2017/0345694 A1 | 11/2017 | Hayashi et al. | |
| 2019/0333775 A1 | 10/2019 | Nishitani et al. | |

FOREIGN PATENT DOCUMENTS

| | | | |
|---|---|---|---|
| CN | 101417407 A | 4/2009 | |
| CN | 102601747 A | 7/2012 | |
| CN | 104690629 A | 6/2015 | |
| CN | 104924199 A | 9/2015 | |
| CN | 105081957 A | 11/2015 | |
| JP | 07-088754 A | 4/1995 | |
| JP | 08-274285 A | 10/1996 | |
| JP | 8274050 A | 10/1996 | |
| JP | h08274050 | * 10/1996 | H01L 21/304 |
| JP | 09-283476 A | 10/1997 | |
| JP | 2001-001258 A | 1/2001 | |
| JP | 2002-264009 A | 9/2002 | |
| JP | 2006347776 A | 12/2006 | |
| JP | 2010-042469 A | 2/2010 | |
| JP | 2010-130022 A | 6/2010 | |
| JP | 5589398 B2 | 9/2014 | |
| JP | 2016-058724 A | 4/2016 | |
| JP | 2017-210396 A | 11/2017 | |
| KR | 10-2018-0067657 A | 6/2018 | |

OTHER PUBLICATIONS

International Search Report and Written Opinion of the European International Searching Authority; PCT/US2019/052369; dated Jan. 10, 2020; 13 Pgs.

Chinese Patent Application No. 201811147777.5, Office Action, dated Aug. 9, 2022, 13 pages, (6 pages of English Translation and 7 pages of Original Copy); Chinese Patent Office.

Japanese Patent Application No. 2021-517290, Office Action dated Aug. 8, 2023, 5 pages (English Translation only), Japanese Patent Office.

* cited by examiner

CARRIER WAFERS AND METHODS OF FORMING CARRIER WAFERS

This application claims the benefit of priority to Chinese Patent Application No. 201811147777.5 filed on Sep. 29, 2018, the content of which is relied upon and incorporated herein by reference in its entirety.

FIELD OF THE DISCLOSURE

The present disclosure generally relates to a method of forming carrier wafers, polishing apparatuses and carrier wafers thereof.

BACKGROUND

The uniformity of thickness across substrates is typically an important characteristic which influences the suitability of use of the substrate. Often, post-production uses of the substrate require a final mechanical and/or chemical polishing and/or cleaning of the substrate in order to provide a sufficiently clean and uniform surface (i.e., to deposit, grow or couple additional layers to the surface). The final chemical and/or mechanical polishing frequently results in the removal of a certain thickness of the substrate. The removal of material from the substrate in the final polish often results in the substrate deviating from predefined specifications resulting in the substrate being unusable.

SUMMARY OF THE DISCLOSURE

According to a first aspect of the present disclosure, a method of forming a carrier wafer includes the steps of: lapping a first surface and a second surface of the carrier wafer such that the carrier wafer is substantially flat, the carrier wafer comprising a glass, glass-ceramic or ceramic material, wherein the carrier wafer has a diameter of from 250 mm to 450 mm and a thickness of from 0.5 mm to 2 mm after lapping; and polishing the first surface of the carrier wafer with at least one of a differential pressure, a differential speed or a differential time between a center portion and an edge portion of the carrier wafer such that the first surface has a convex or concave shape.

According to a second aspect, the method of aspect 1 is provided, wherein the step of polishing the first surface of the carrier wafer comprises polishing the first surface of the carrier wafer with a differential pressure between the center portion and the edge portion, further wherein the differential pressure is from 5 psi to 20 psi.

According to a third aspect, the method of aspect 1 is provided, wherein the first surface of the carrier wafer is configured to polish to a substantially flat shape via a finish polishing step performed after the polishing step.

According to a fourth aspect, the method of aspect 1 further comprises the step, finish polishing the center portion and the edge portion of the first surface to a substantially flat shape after the polishing step, wherein at least one of the carrier wafer and a polishing pad are rotated relative to one another during the finish polishing step such that the center portion and the edge portion of the first surface are polished at different rates simultaneously.

According to a fifth aspect, the method of aspect 1 is provided, wherein the step of polishing the first surface of the carrier wafer defines a convex shape.

According to a sixth aspect, the method of aspect 1 is provided, wherein the step of polishing the first surface of the carrier wafer defines a concave shape.

According to a seventh aspect, the method of aspect 1 is provided, wherein the step of polishing the first surface further comprises rotating a polishing head against the first surface of the carrier wafer.

According to an eighth aspect, the method of aspect 1 is provided, wherein the first and second surfaces are on opposite sides of the carrier wafer.

According to a ninth aspect, the method of aspect 8 is provided, wherein the lapping of the first surface and the second surface is performed substantially simultaneously.

According to a tenth aspect, the method of aspect 1 is provided, wherein a difference in thickness between the center portion and the edge portion of the carrier wafer is from 1 µm to 5 µm after the step of polishing the first surface of the carrier wafer with the differential pressure is performed.

According to an eleventh aspect, the method of aspect 1 is provided, wherein the carrier wafer is substantially circular.

According to a twelfth aspect, the method of aspect 11 is provided, wherein the carrier wafer has an outside diameter of from 200 mm to 400 mm.

According to a thirteenth aspect of the present disclosure, a polishing apparatus includes an adjustable weight, a polishing head coupled to a motor, a turntable; and a lever coupled to the motor and a counterweight, the motor and the counterweight being positioned on opposite ends of a pivot point of the lever. The adjustable weight and the counterweight are configured to change a force applied to the polishing head.

According to a fourteenth aspect, the polishing apparatus of aspect 13 is provided, wherein the pivot point of the lever is coupled to a support structure.

According to a fifteenth aspect, the polishing apparatus of aspect 13 is provided, wherein a step motor is positioned above the adjustable weight.

According to a sixteenth aspect, the polishing apparatus of aspect 13 is provided, wherein the polishing head is configured to tilt.

According to a seventeenth aspect of the present disclosure, a carrier wafer includes a body defining a first surface having a center portion and an edge portion and a second surface on an opposite side of the body than the first surface, the first surface defining a substantially convex or concave shape and the second surface being substantially flat. The first surface is configured to polish to a substantially flat shape under differential polishing rates between the center portion and the edge portion.

According to an eighteenth aspect, the carrier wafer of claim 17 is provided, wherein a difference in thickness between the center portion and the edge portion of the carrier wafer is from 1 µm to 5 µm.

According to a nineteenth aspect, the carrier wafer of claim 17 is provided, wherein the carrier wafer comprises glass.

According to a twentieth aspect, the carrier wafer of claim 17 is provided, wherein the first surface defines a concave shape.

These and other features, advantages, and objects of the present disclosure will be further understood and appreciated by those skilled in the art by reference to the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION

Additional features and advantages of the invention will be set forth in the detailed description which follows and will be apparent to those skilled in the art from the description, or recognized by practicing the invention as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other. As used herein, the term "substantially flat" means that a body defining a surface which is substantially flat has a total thickness variation of 1 µm or less.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

Figure 1A:
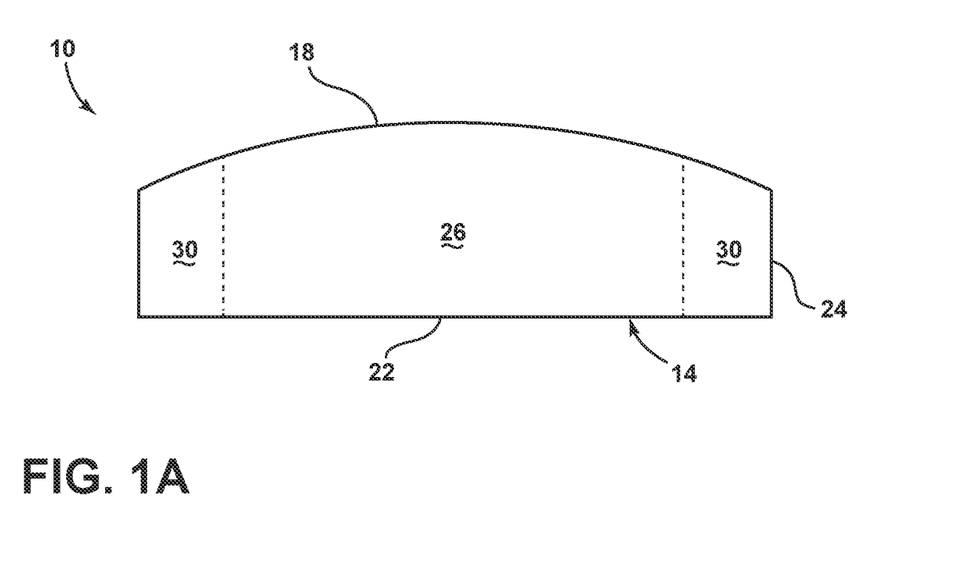
FIG. 1A is a cross-sectional view of a carrier wafer, according to at least one example.
Figure 1B:
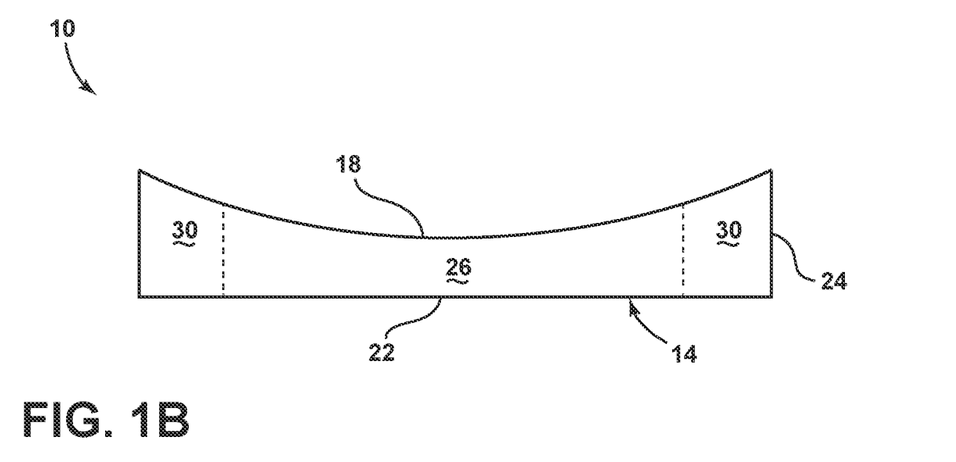
FIG. 1B is a cross-sectional view of a carrier wafer, according to at least one example.

Referring now to FIGS. 1A and 1B, depicted is a carrier wafer 10. The carrier wafer 10 has a body 14 which defines opposing primary surfaces referred to as a first surface 18 and a second surface 22. According to various examples, the carrier wafer 10 may further define one or more minor surfaces 24 positioned along edges of the body 14. In yet other examples, portions of the first surface 18 and the second surface 22 may meet or intersect. The body 14 of the carrier wafer 10 includes a center portion 26 which is inboard or inwardly located to an edge portion 30. The edge portion 30 of the carrier wafer 10 is positioned proximate to an edge of the body 14 of the carrier wafer 10. The edge portion 30 may further surround the center portion 26. The body 14 of the carrier wafer 10 may have a circular, oblong, oval, triangular, square, rectangular, pentagon or higher order polygon shape.

The carrier wafer 10 may have an outside diameter or largest exterior width of from 200 mm to 450 mm or from 250 mm to 450 mm. For example, the outside diameter or largest exterior width may be 200 mm, or 210 mm, or 220 mm, or 230 mm, or 240 mm, or 250 mm, or 260 mm, or 270 mm, or 280 mm, or 290 mm, or 300 mm, or 310 mm, or 320 mm, or 330 mm, or 340 mm, or 350 mm, or 360 mm, or 370 mm, or 380 mm, or 390 mm, or 400 mm or any and all values and ranges between any of these values as endpoints. It will be understood that the circular examples of the carrier wafer 10 have a diameter while multi-sided examples of the carrier wafer 10 may have a longest length measured from corners of the body 14.

The first surface 18 of the carrier wafer 10 may take or define a variety of shapes. For example, the first surface 18 may define a substantially convex shape (i.e., FIG. 1A). In the convex shape example, the first surface 18 has a positive principal radii of curvature such that a portion of the first surface 18 extending over the center portion 26 may generally be higher than the portion of the first surface 18 extending over the edge portion 30. In other words, the first surface 18 extends in a direction away from the second surface 22 such that the body 14 of the carrier wafer 10 may be thicker in the center portion 26 relative to the edge portion 30 in convex examples. The apex of the convex shape of the first surface 18 may be located in a center of the carrier wafer 10 or may be offset from a center of the carrier wafer 10. In yet other examples, the first surface 18 may have a concave shape (i.e., FIG. 1B). In the concave shape examples, the first surface 18 has a negative principal radii of curvature such that the portion of the first surface 18 extending over the center portion 26 may generally be lower than the first surface 18 extending over the edge portion 30. In other words, concave examples of the first surface 18 extend in a direction toward the second surface 22 of the body 14 such that the carrier wafer 10 may be thinner in the center portion 26 relative to the edge portion 30. The thinnest point of the concave shape of the first surface 18 may be located in a center of the carrier wafer 10 or may be offset. It will be understood that the principal radii of curvature of the first surface 18 may be the same across the first surface 18 or may be different (i.e., intentionally and/or due to manufacturing tolerances) without departing from the teachings provided herein.

According to various examples, the carrier wafer 10 may have a thickness (i.e., as measured from the first surface 18 to the second surface 22) ranging from 50 μm to 5 mm at its thickest point. Carrier wafer 10 may have a thickness of 100 μm, 200 μm, 300 μm, 400 μm, 500 μm, 600 rpm, 700 rpm, 800 rpm, 900 rpm, 1000 μm, 2 mm, 3 mm, 4 mm, 5 mm, or any range having any two of these values as endpoints. The thickness of the carrier wafer 10 may range from 1 μm to 1000 μm, or 100 μm to 500 μm. It will be understood that the thickness of the carrier wafer 10 may vary over its length (i.e., in a periodic manner or randomly).

The carrier wafer 10 may have a total thickness variation across the first surface 18. The total thickness variation is defined as the difference between the thickest point of the carrier wafer 10 and the thinnest point of the carrier wafer 10 while the carrier wafer 10 is clamped in place. The total thickness variation across the first surface 18 may be 0.2 μm, or 0.4 μm, or 0.6 μm, or 0.8 μm, or 1.0 μm, or 1.2 μm, or 1.4 μm, or 1.6 μm, or 1.8 μm, or 2.0 μm, or 2.2 μm, or 2.4 μm, or 2.6 μm, or 2.8 μm, or 3.0 μm, or 3.2 μm, or 3.4 μm, or 3.6 μm, or 3.8 μm, or 4.0 μm, or 4.2 μm, or 4.4 μm, or 4.6 μm, or 4.8 μm, or 5.0 μm or any range having any two of these values as endpoints, or any range having any one of these values as an upper endpoint. The total thickness variation may be from 0.1 μm to 50 μm, or from 0.1 μm to 40 μm, or from 0.1 μm to 30 μm, or from 0.1 μm to 20 μm, or from 0.1 μm to 10 μm, or from 1 μm to 5 μm. According to various examples, the total thickness variation may be between the edge (i.e., the furthest or most outboard portion of the first surface 18) of the carrier wafer 10 and the thickest point (i.e., the apex of the convex first surface 18) of the carrier wafer 10 or the thinnest point (i.e., the lowest point of the concave first surface 18) of the carrier wafer 10. As such, a difference in thickness (i.e., the total thickness variation) between the center portion 26 and the edge portion 30 of the carrier wafer 10 may be from 1 μm to 5 μm.

As explained above, the first surface 18 has a positive principal radii of curvature for convex examples. In convex examples of the first surface 18, the principal radii of curvature may be 2 m, or 4 m, or 10 m, or 100 m, or 1000 m, or 2000 m, or 3000 m, or 4000 m, or 5000 m or any and all values and or any range having any two of these values as endpoints, or any range having any one of these values as an upper endpoint. In concave examples of the first surface 18, the principal radii of curvature may be negative. For concave examples of the first surface 18, the principal radii of curvature may be −2 m, or −4 m, or −10 m, or −100 m, or −1000 m, or −2000 m, or −3000 m, or −4000 m, or −5000 m or any and all values and or any range having any two of these values as endpoints, or any range having any one of these values as an upper endpoint.

As will be explained in greater detail below, the first surface 18 of the carrier wafer 10 may be configured to polish to a substantially flat shape (i.e., such that the body 14 of the carrier wafer 10 has a total thickness variation of 1 μm or less) when a polishing pad is applied to the first surface 18. Conventional substrates often undergo one or more polishing steps after being purchased and transferred to a customer. In applications where the tolerances of the total thickness variation of the substrate are particularly narrow, even a cleaning or polishing step may remove sufficient material from the substrate to lead to the substrate falling out of tolerance. Often, a contributing factor in such polishing induced tolerance failures is the differential polishing rates of rotational polishing (i.e., due to different rotational rates of the circular polishing structure). Use of the presently disclosed carrier wafer 10 and first surface 18 may be advantageous in compensating for the expected polishing step by employing the concave or convex shaped first surface 18. The concave or convex shape of the first surface 18 allows the subsequent differential rate of polishing, and removal of material, on the first surface 18 to level out such that the first surface 18 is substantially flat or planar post-polishing.

According to various examples, the second surface 22 of the carrier wafer 10 is substantially flat. For example, the second surface 22 may have a deviation in height of from 0.1 μm to 1 μm. In yet other examples, the second surface 22 may be curved (i.e., concave and/or convex), faceted and/or have other shapes without departing from the teachings provided herein.

The carrier wafer 10 may include a glass, a glass-ceramic, a ceramic material and/or combinations thereof. Exemplary glass-based examples of carrier wafer 10 may include soda lime glass, alkali aluminosilicate glass, alkali containing borosilicate glass and/or alkali aluminoborosilicate glass. For purposes of this disclosure, the term "glass-based" may mean a glass, a glass-ceramic and/or a ceramic material. According to various examples, the carrier wafer 10 may be a glass-based carrier wafer 10. In glass-based examples of the carrier wafer 10, the carrier wafer 10 may be strengthened or strong. For instance, glass examples of the carrier wafer 10 may be thermally tempered (e.g., for strong carrier wafers 10) or have an ion-exchanged region (e.g., for strengthened carrier wafers 10). Further, the carrier wafer 10 may include sapphire and/or polymeric materials. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins. Further, the carrier wafer 10 may be composed of one or more crystalline materials. For example, the carrier wafer 10 may be composed of one or more silicon crystals (i.e., silicon wafers).

According to various examples, the carrier wafer 10 may be configured to be used for the formation of, or support of, one or more semiconductor panels. In such examples, the carrier wafer 10 may be composed of a glass or glass-ceramic and may be used to transport or carry one or more semiconductors, electrical sensors and/or other electrical components. As such, the carrier wafer 10 may be utilized in a "semiconductor on glass" process.

Figure 2:
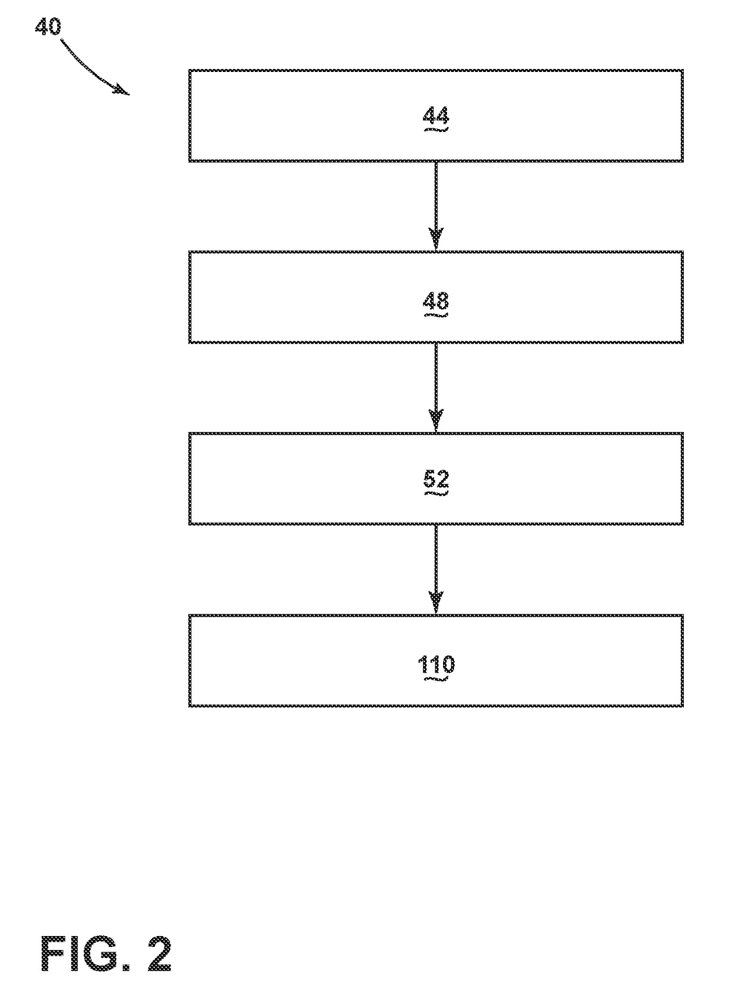
FIG. 2 is a flowchart of a method of forming the carrier wafer, according to at least one example.

Referring now to FIG. 2, depicted is a method 40 of forming the carrier wafer 10. The method 40 may begin with a step 44 of lapping the first surface 18 and the second surface 22 of the carrier wafer 10 such that the carrier wafer 10 is substantially flat. As explained above, the carrier wafer 10 may be composed of a glass, glass-ceramic or ceramic material. Further, the carrier wafer 10 may have a diameter of from 250 mm to 450 mm and a thickness of from 0.5 mm to 2 mm after lapping. As used herein, lapping is a machining process in which two surfaces are rubbed together with a plurality of loose or free rolling abrasives between them. Lapping may be performed using a lapping machine which is configured to employ one or more abrasives harder than the material of the carrier wafer 10. The abrasives are placed between a lapping plate and the first surface 18 of the carrier wafer 10 such that the first surface 18 is ground. The abrasives used in the lapping process of step 44 may include aluminum oxide, emery, silicon carbide, boron carbide, diamond and/or tungsten carbide According to various examples, both the first surface 18 and the second surface 22 may be lapped at the same time or substantially simultaneously. In such an example, the carrier wafer 10 may be placed into and/or passed through a lapping machine such that both the first surface 18 and the second surface 22 are lapped. Lapping of the first surface 18 and/or the second surface 22 may result in the first surface 18 and/or second surface 22 being substantially flat. As such, the carrier wafer 10 may have a bow, warp, roughness and/or other aspect which is reduced or eliminated by the lapping of both the first surface 18 and the second surface 22. In addition to lapping the first surface 18 and/or second surface 22, the first surface 18 and/or second surface 22 may be polished.

Next, a step 48 of cleaning the first surface 18 of the carrier wafer 10 is performed. As used herein, cleaning is defined as the removal of particulates and/or contaminants from the first surface 18 which may tend to scratch, mar or otherwise decrease an optical quality of the first surface 18. Cleaning of the carrier wafer 10 may be performed using polar liquids, surfactants, non-polar liquids and/or combinations thereof. For example, the carrier wafer 10 may be rinsed and cleansed in water and a surfactant and subsequently rinsed with an alcohol. Further, the cleaning of the carrier wafer 10 may be performed with the aid of ultrasonic pulses and/or compressed gases. It will be understood that in examples where the first surface 18 and the second surface 22 are each lapped, both the first surface 18 and the second surface 22 may be cleaned, either secretly or simultaneously. Cleaning of the first surface 18 and/or second surface 22 may be advantageous in removing large or course abrasives present on the first surface 18 and/or second surface 22 which may interfere with later polishing steps.

Figure 3A:
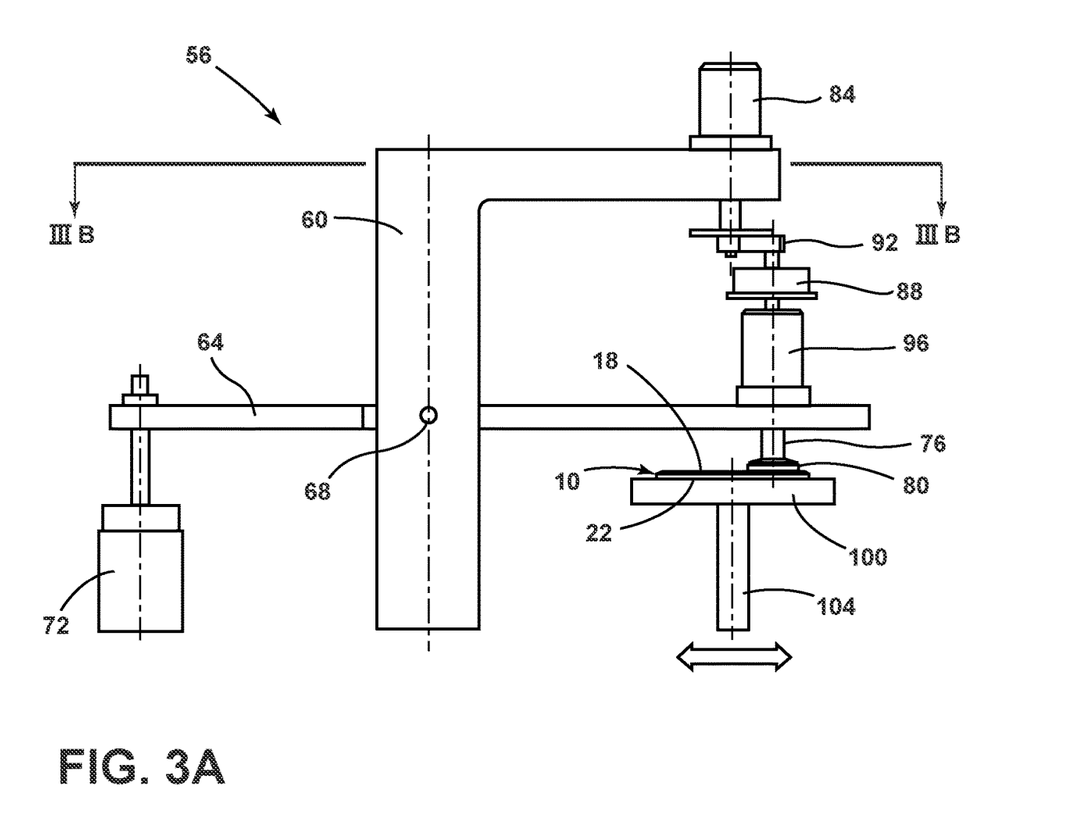
FIG. 3A is a schematic elevation view of a polishing apparatus, according to at least one example.
Figure 3B:
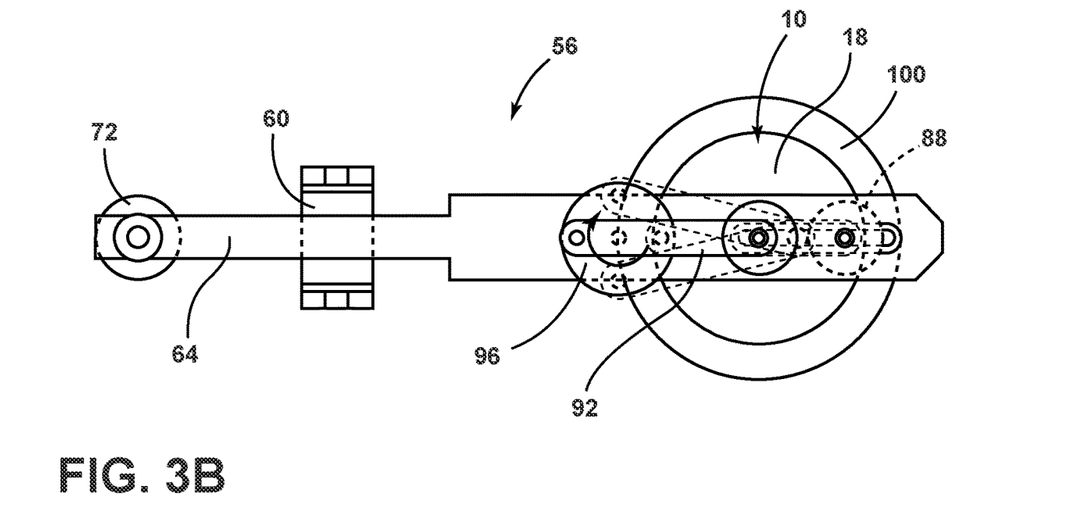
FIG. 3B is a cross-sectional view taken at line IIIB-IIIB of FIG. 3A, according to at least one example.

Referring now to FIGS. 2, 3A and 3B, a step 52 polishing the first surface 18 of the carrier wafer 10 with at least one of a differential pressure, a differential speed or a differential time between the center portion 26 and the edge portion 30 of the carrier wafer 10 such that the first surface 18 has a convex or concave shape is performed. As used herein, polishing is defined as a process where a plurality of abrasive grains is charged into a fibrous polishing cloth and the cloth is applied to a workpiece. It will be understood that polishing may be capable of both decreasing a roughness of a surface (e.g., the first surface 18) as well as removing a small amount of material (e.g., 0.2 µm to about 10 µm) from the surface. Step 52 may be carried out with the use of a polishing apparatus 56. It will be understood that although referred to as a polishing 56, slurries, pads and abrasives may be changed such that the polishing apparatus 56 may be a lapping apparatus and used in step 44. In the depicted example, the polishing apparatus 56 is a single side contouring or polishing apparatus 56, but it will be understood that the polishing apparatus 56 may polish multiple surfaces at once. Further, more than one carrier wafer 10 may be polished at a time by the polishing apparatus 56. The polishing apparatus 56 includes a support structure 60 to which a lever 64 is pivotally coupled through a pivot 68. At one end of the lever 64 is a counterweight 72. At the opposite end of the lever 64 is an arm 76 coupled to a polishing head 80. The support structure 60 supports a step motor 84 which is coupled to an adjustable weight 88 through a crankshaft 92. The adjustable weight 88 is positioned above a polishing motor 96 which spins the polishing head 80. The polishing motor 96 is coupled to the lever 64. According to various examples, the polishing head 80 is smaller than the carrier wafer 10 and/or the first surface 18. The polishing head 80 contacts and polishes the first surface 18 of the carrier wafer 10 which is positioned on a turntable 100 mounted to a shaft 104. The polishing head 80 may have a diameter of from 25 mm to 75 or 50 mm. As such, the polishing head 80 may be smaller in diameter than the carrier wafer 10.

In operation of the polishing apparatus 56, the carrier wafer 10 is loaded into or onto the turntable 100. According to various examples, the first surface 18 of the carrier wafer 10 is exposed and facing the polishing head 80 while the second surface 22 is placed on the turntable 100. The carrier wafer 10 and/or second surface 22 may be secured in place via a vacuum-assisted method or through a chuck. In vacuum examples, a vacuum may be generated between the second surface 22 and the turntable 100 such that the carrier wafer 10 is retained in position. In chuck examples, the carrier wafer 10 may be gripped around its periphery and/or a locking pin coupling with a groove in the 10 may be used.

Once the carrier wafer 10 is secured to the turntable 100, the turntable 100 is raised toward the polishing head 80 and the turntable 100 begins spinning or rotating. The turntable 100 starts at relatively low revolutions-per-minute (RPM) in a lower position and gradually raises up to contact the first surface 18 with the polishing head 80. The polishing head 80 may be rotated at a rate of from 3000 RPM to 10,000 RPM through the use of the polishing motor 96. According to various examples, the polishing head 80 is tiltable relative to the first surface 18 of the carrier wafer 10 such that the polishing head 80 remains in contact with the first surface 18 while the polishing head 80 is rotated around the carrier wafer 10. In other words, the polishing head 80 is configured to tilt. According to various examples, the polishing head 80 may be a ring with a hollow center such that differences in speed across the polishing head 80 are minimized. A slurry containing one or more abrasives (i.e. having a smaller size than the abrasive used for lapping) is supplied to the interface between the first surface 18 and the polishing head 80. For example, the abrasive grain size used in lapping may have a size range of from 5 μm to 20 μm while abrasive grains used in polishing may have a size range of 3 μm or less. The polishing head 80 may utilize a mixture of $CeO_2$ and a carrier medium (e.g., water) during the polishing of the first surface 18.

The relative location of the polishing head 80 and the first surface 18 of the carrier wafer 10 may be altered by use of the step motor 84 (i.e., which turns the crankshaft 92 to move the polishing head 80) and by translating the turntable 100 by moving the shaft 104. The polishing head 80 may begin by polishing the first surface 18 proximate the edge (i.e., on the edge portion 30), and moving toward the center (i.e., the center portion 26). It will be understood that the polishing head 80 may alternatively start polishing the first surface 18 at a center and move towards the edge.

As explained above, the first surface 18 may be polished into the convex or concave shape through the use of differential pressure, differential speed or differential time between the center portion 26 and the edge portion 30. In convex differential pressure examples, the polishing pressure between the polishing head 80 and the first surface 18 is increased as the polishing head 80 moves from the center portion 26 toward the edge portion 30. To produce a concave shaped first surface 18, polishing pressure between the polishing head 80 and the first surface 18 is decreased as the polishing head 80 is moved from the center portion 26 to the edge portion 30. The polishing head 80 may reciprocate between the center portion 26 and the edge portion 30 of the carrier wafer 10 and/or may move in a circular manner around the first surface 18 of the carrier wafer 10.

Depending on the degree of curvature (i.e. both convex and concave) of the first surface 18, the weight of the adjustable weight 88 and counterweight 72 may be altered. Through the addition or subtraction of weight on the adjustable weight 88 and/or through the change of weight on the counterweight 72, the force provided by the polishing head 80 onto the first surface 18 of the carrier wafer 10 may be altered. By altering the force between the polishing head 80 and the carrier wafer 10 and the period of time the force is applied, varying amounts of material of the carrier wafer 10 may be removed to sculpt the first surface 18 into the shapes explained above. In other words, applying a differential polishing pressure across the first surface 18 may shape the first surface 18 into the above notes shapes. As the second surface 22 is positioned against the turntable 100, the second surface 22 may keep the shape (i.e., flat) that was formed during step 44.

As used herein, the term "absolute pressure" is defined as the pressure applied to any one point on the first surface 18 of the carrier wafer 10 by the polishing head 80. The absolute pressure applied to any one point on the first surface 18 of the carrier wafer 10 may be 0.1 psi, 0.5 psi, 1 psi, or 2 psi, or 3 psi, or 4 psi, or 5 psi, or 6 psi, or 7 psi, or 8 psi, or 9 psi, or 10 psi, or 11 psi, or 12 psi, or 13 psi, or 14 psi, or 15 psi, or 16 psi, or 17 psi, or 18 psi, or 19 psi, or 20 psi, or 25 psi, or 30 psi or any range having any two of these values as endpoints, or any range having any one of these values as an upper endpoint. For example, the absolute pressure applied to any one point on the first surface 18 of the carrier wafer 10 may be from 0.5 psi to 30 psi, or from 0.5 psi to 25 psi, or from 0.5 psi to 20 psi, or from 1 psi to 20 psi, or from 1 psi to 15 psi, or from 1 psi to 10 psi, or from 1 psi to 5 psi.

As used herein, the term "differential pressure" is defined as the difference between the absolute pressure of the polishing head 80 at the point of lowest pressure and the point of highest pressure. The differential pressure may be 0.1 psi, or 0.5 psi, or 1 psi, or 2 psi, or 3 psi, or 4 psi, or 5 psi, or 6 psi, or 7 psi, or 8 psi, or 9 psi, or 10 psi, or 11 psi, or 12 psi, or 13 psi, or 14 psi, or 15 psi, or 16 psi, or 17 psi, or 18 psi, or 19 psi, or 20 psi, or 25 psi, or 30 psi or any range having any two of these values as endpoints, or any range having any one of these values as an upper endpoint. For example, the differential pressure may be from 0.5 psi to 30 psi, or from 0.5 psi to 25 psi, or from 0.5 psi to 20 psi, or from 1 psi to 20 psi, or from 1 psi to 15 psi, or from 1 psi to 10 psi, or from 1 psi to 5 psi. It will be understood that in differential pressure examples, the pressure may gradually change between the highest and lowest pressure points of the first surface 18 rather than in a step-wise manner.

In convex examples of the first surface 18, the center portion 26 of the carrier wafer 10 may have a low pressure or essentially no pressure applied thereto while the edge portion 30 may have a greater pressure (e.g., 20 psi) applied thereto. In such an example, the absolute pressure applied to the center portion 26 may be 0 psi or 0.5 psi and the absolute pressure applied to the edge portion 30 may be 20 psi such that a differential pressure between the center portion 26 and the edge portion 30 is approximately 20 psi. It will be understood that that the absolute pressure values for the center portion 26 and the edge portion 30 may be reversed for concave examples of the first surface 18. Further, it will be understood that any combination of the above-noted absolute pressures may be utilized between the center portion 26 and the edge portion 30 to achieve the differential pressure without departing from the teachings provided herein.

In examples of step 52 using differential speed to shape the first surface 18, the speed of the polishing motor 96 (i.e., and therefore the polishing head 80) may be adjusted to produce a differential polish between the center portion 26 and the edge portion 30. For convex examples, as the polishing head 80 is moved from the center of the first surface 18 toward the edge, the speed of the polishing motor 96 may be increased such that more material is removed from the first surface 18 proximate the edge portion 30. In concave examples, as the polishing head 80 is moved from the edge portion 30 of the first surface 18 toward the center portion 26, the speed of the polishing motor 96 may be increased such that more material is removed from the first surface 18 proximate the center portion 26.

As used herein, the term "absolute speed" is defined as the revolutions-per-minute the polishing head 80 is moving at any one point on the first surface 18 of the carrier wafer 10. The absolute speed of the polishing head 80 at any one point on the first surface 18 of the carrier wafer 10 may be 60 RPM, or 100 RPM, or 500 RPM, or 1000 RPM, or 2000 RPM, or 3000 RPM, or 4000 RPM, or 5000 RPM, or 6000 RPM, or 7000 RPM, or 8000 RPM, or 9000 RPM, or 10000 RPM or any range having any two of these values as endpoints, or any range having any one of these values as an upper endpoint. For example, the absolute speed applied to any one point on the first surface 18 of the carrier wafer 10 may be from 60 RPM to 10000 RPM, or from 3000 RPM to 10000 RPM, or from 4000 RPM to 9000 RPM, or from 5000 RPM to 8000 RPM, or from 6000 RPM to 7000 RPM.

As used herein, the term "differential speed" is defined as the difference between the absolute speed of the polishing head 80 at the point of lowest speed and the point of highest speed. The differential speed may be may be 1 RPM, or 10 RPM, or 50 RPM, or 100 RPM, or 200 RPM, or 300 RPM, or 400 RPM, or 500 RPM, or 1000 RPM, or 3000 RPM, or 4000 RPM, or 5000 RPM, or 6000 RPM, or 7000 RPM, or 8000 RPM, or 9000 RPM or any range having any two of these values as endpoints, or any range having any one of these values as an upper endpoint. For example, the differential speed applied to any one point on the first surface 18 of the carrier wafer 10 may be from 10 RPM to 9000 RPM, or from 100 RPM to 8000 RPM, or from 1000 RPM to 7000 RPM, or from 2000 RPM to 6000 RPM, or from 3000 RPM to 5000 RPM. It will be understood that in differential speed examples, the speed may gradually change between the fastest and slowest speed points of the first surface 18 rather than in a step-wise manner.

In examples of step 52 using differential time to shape the first surface 18, the residence time of the polishing head 80 over the center portion 26 versus the edge portion 30 may be altered to preferentially remove material from the first surface 18. For convex examples, as the polishing head 80 is moved from the center of the first surface 18 toward the edge, the residence time of the polishing head 80 over a point on the first surface 18 may be increased such that more material is removed from the first surface 18 proximate the edge portion 30. In concave examples, as the polishing head 80 is moved from the edge portion 30 of the first surface 18 toward the center portion 26, the residence time of the polishing head 80 over a point on the first surface 18 may be increased such that more material is removed from the first surface 18 proximate the center portion 26.

For purposes of this disclosure the term "absolute time" is the time that a point on the first surface 18 of the carrier wafer 10 is exposed to the polishing pad 80. The absolute time may be 1 second, 30 seconds, 1 minute, 5 minutes, 10 minutes, 15 minutes, 20 minutes, 30 minutes, 40 minutes, 45 minutes, 50 minutes, 55 minutes, 60 minutes, 120 minutes or any range having any two of these values as endpoints, or any range having any one of these values as an upper endpoint. For example, the absolute time may be from 1 second to 120 minutes, or from 1 second to 60 minutes, or from 1 minute to 60 minutes, or from 10 minutes to 60 minutes, or from 10 minutes to 30 minutes, or from 10 minutes to 20 minutes. As used herein, the term "differential time" is defined as the difference between the absolute time the polishing head 80 spends at the point of shortest time and the point of longest time. The differential time may be 1 second, 30 seconds, 1 minute, 5 minutes, 10 minutes, 15 minutes, 20 minutes, 30 minutes, 40 minutes, 45 minutes, 50 minutes, 55 minutes 60 minutes, 120 minutes or any range having any two of these values as endpoints, or any range having any one of these values as an upper endpoint. For example, the differential time may be from 1 second to 60 minutes, or from 1 minute to 60 minutes, or from 10 minutes to 60 minutes, or from 10 minutes to 30 minutes, or from 10 minutes to 20 minutes. It will be understood that in differential time examples, the time may gradually change between the longest and shortest time points of the first surface 18 rather than in a step-wise manner.

In convex examples of the first surface 18, the center portion 26 of the carrier wafer 10 may have a shorter absolute time that the polishing head 80 is applied thereto while the edge portion 30 may have a longer absolute time that the polishing head 80 is applied thereto. In such an example, the absolute time that the polishing head 80 is applied to the center portion 26 may be from 1 second to 1 minute and the absolute time of the edge portion 30 may be 60 minutes such that a differential time between the center portion 26 and the edge portion 30 is approximately 60 minutes. It will be understood that that the absolute time values for the center portion 26 and the edge portion 30 may be reversed for concave examples of the first surface 18.

After step 52 of polishing the first surface 18, the carrier wafer 10 may have a curved (i.e., convex or concave) first surface 18. As explained above, the curved first surface 18 may be beneficial in that it is configured to undergo a finish polishing step to a substantially flat first surface 18. Such a feature may be advantageous in that the carrier wafer 10 may be sold or otherwise transferred to a customer (i.e., after step 52) as is and when the customer performs a finish polishing step (i.e., to clean or smooth the carrier wafer 10), the first surface 18 will be substantially flat and ready for use. According to yet other examples, the carrier wafer 10 may then be stored or otherwise kept and the finish polishing step may be carried out by the manufacturer of the carrier wafer 10. As such, a next step 110 of finish polishing the center portion 26 and the edge portion 30 of the first surface 18 to a substantially flat shape after the polishing step 52. At least one of the carrier wafer 10 and a polishing pad are rotated relative to one another during the finish polishing step 110 such that the center portion 26 and the edge portion 30 of the first surface 18 are polished at different rates simultaneously. Step 110 may be performed either by the original manufacturer of the carrier wafer 10 or by a subsequent user or customer. The polishing pad may be part of a chemical, a mechanical and/or a chemical-mechanical polishing step. In chemical-mechanical polishing, an abrasive and corrosive chemical slurry (e.g., a colloid) in conjunction with the polishing pad are used on the carrier wafer 10. The polishing pad is pressed against the first surface 18 of the carrier wafer 10 and is rotated in order to polish the first surface 18. According to various examples, the polishing pad is rotated about different axes of rotation (i.e., not concentric) such that the material of the first surface 18 is removed. Additionally or alternatively to the polishing pad rotating, the carrier wafer 10 may be rotated such that relative motion between the polishing pad and the first surface 18 is achieved.

As a result of step 110, polishing of the center portion 26 and the edge portion 30 of the first surface 18 simultaneously occurs at different rates such that the first surface 18 polishes to a substantially flat shape. As explained above, the first surface 18 of the carrier wafer 10 may be convex or concave, each of these shapes resulting in total thickness variation between the center portion 26 and the edge portion 30. In convex examples of the first surface 18, as the polishing pad of the chemical-mechanical polishing contacts the first surface 18, the relatively higher center portion 26 of the first surface 18 is preferentially polished by the polishing pad due to increased force related to the elevation of the center portion 26. The increase in elevation leads to greater force being applied to the center portion 26 such that the center portion 26 of the first surface 18 is polished at a faster rate than the edge portion 30. As explained above, the relative heights of the center portion 26 and the edge portion 30 are tailored such that the differential polishing rates between the center portion 26 and the edge portion 30 result in a substantially flat first surface 18.

Similarly to convex examples of the first surface 18, concave examples of the first surface 18 also take advantages of the differential polishing rates to yield a substantially flat first surface 18. In concave examples, the edge portion 30 of the first surface 18 is elevated relative to the center portion 26 such that the edge portion 30 is preferentially polished at a rate greater than the center portion 26. As such, the differential polishing rates of the center portion 26 and the edge portion 30 due to the concave shape of the first surface 18 result in a substantially flat first surface 18.

Once the first surface 18 has been polished to a substantially flat shape, the first surface 18 may be cleaned and prepared for later uses of the carrier wafer 10. According to various examples, the carrier wafer 10 may be used as a carrier for a silicon wafer. In such an example, a silicon wafer may be bonded (e.g., reversibly or irreversibly) to the first surface 18 of the carrier wafer 10. In such examples, a highly uniformly flat first surface 18 may be advantageous.

Use of the present disclosure may offer a variety of advantages. First, the above-described method 40 and polishing apparatus 56 may be utilized for both silicon wafers and optical lenses. For example, as both silicon wafers and optical lenses often incur an additional polishing step by a customer, utilizing the above-noted disclosure may allow for such downstream manufacturing techniques to result in a higher yield. Further, as conventional manufacturing techniques often result in conventional substrates having irregular surfaces, providing the carrier wafer 10 with a known curvature which is configured to produce a substantially flat first surface 18 may reduce the complexity associated with correcting the irregular surface of conventional substrates.

Second, use of the method 40 and the polishing apparatus 56 may reduce and/or eliminate total thickness variation, total indicated reading, local focal plane deviation and local thickness variation of the carrier wafer 10. For example, by lapping the first surface 18 and the second surface 22 and then subsequently polishing the first surface 18 with the polishing apparatus 56, the above-noted potential defects of the carrier wafer 10 may be reduced.

Third, use of the polishing apparatus 56 allows for flexible and precision control of the first surface 18 of the carrier wafer 10. In conventional substrates, grinding and polishing the substrate to the proper profile may be difficult. Use of the presently disclosed polishing apparatus 56 and its adjustable weight 88 allows for the precision control of the first surface 18.

Fourth, the polishing apparatus 56 offers a low-cost fixture to provide the polishing of the carrier wafer 10. For example, use of the adjustable weight 88, the lever 64 and the counterweight 72 offers a simple, adjustable and mechanically robust manner of adjusting the force applied by the polishing head 80 to the carrier wafer 10 such that a differential pressure may be applied to the first surface 18 of the carrier wafer 10.

Fifth, the polishing apparatus 56 provides a scalable system for increased production of the carrier wafer 10. For example, a single polishing apparatus 56 may be outfitted with a plurality of polishing heads 80 and/or a plurality of polishing apparatuses 56 may be utilized to increase the number of carrier wafers 10 produced simultaneously.

Sixth, as the lapping of the carrier wafer 10 performed in step 44 may produce highly uniform first surfaces 18 and/or second surfaces 22, a high yield of carrier wafers 10 may be achieved as the polishing apparatus 56 has a highly consistent feedstock.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

It will be understood that any described processes, or steps within described processes, may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and, further, it is to be understood that such concepts are intended to be covered by the following claims, unless these claims, by their language, expressly state otherwise.

What is claimed is:

1. A method of forming a carrier wafer, the method comprising the steps of:
    lapping a first surface and a second surface of the carrier wafer such that the carrier wafer is substantially flat,
        the carrier wafer comprising a glass, glass-ceramic or ceramic material, and
        the carrier wafer having a diameter from 250 mm to 450 mm and a thickness from 0.5 mm to 2 mm after lapping; and
    polishing the first surface of the carrier wafer with at least one of a differential pressure, a differential speed, or a differential time between a center portion and an edge portion of the carrier wafer such that the first surface has a convex or concave shape,
        wherein a total thickness variation across the first surface is from 1 µm to 5 µm after the step of polishing the first surface of the carrier wafer is performed.

2. The method of claim 1, wherein the step of polishing the first surface of the carrier wafer comprises polishing the first surface of the carrier wafer with a differential pressure between the center portion and the edge portion, further wherein the differential pressure is from 5 psi to 20 psi.

3. The method of claim 1, wherein the first surface of the carrier wafer is configured to polish to a substantially flat shape via a finish polishing step performed after the polishing step.

4. The method of claim 1, further comprising the step:
    finish polishing the center portion and the edge portion of the first surface to a substantially flat shape after the polishing step, wherein at least one of the carrier wafer and a polishing pad are rotated relative to one another during the finish polishing step such that the center portion and the edge portion of the first surface are polished at different rates simultaneously.

5. The method of claim 1, wherein the step of polishing the first surface of the carrier wafer defines a convex shape.

6. The method of claim 1, wherein the step of polishing the first surface of the carrier wafer defines a concave shape.

7. The method of claim 1, wherein the step of polishing the first surface further comprises rotating a polishing head against the first surface of the carrier wafer.

8. The method of claim 1, wherein the first and second surfaces are on opposite sides of the carrier wafer.

9. The method of claim 8, wherein the lapping of the first surface and the second surface is performed substantially simultaneously.

10. The method of claim 1, wherein the carrier wafer is substantially circular.

11. The method of claim 10, wherein the carrier wafer has an outside diameter of from 200 mm to 400 mm.

12. A polishing apparatus, comprising:
an adjustable weight;
a polishing head coupled to a motor;
a turntable; and
a lever coupled to the motor and a counterweight, the motor and the counterweight being positioned on opposite ends of a pivot point of the lever, wherein the adjustable weight and the counterweight are configured to change a force applied to the polishing head.

13. The polishing apparatus of claim 12, wherein the pivot point of the lever is coupled to a support structure.

14. The polishing apparatus of claim 12, wherein a step motor is positioned above the adjustable weight.

15. The polishing apparatus of claim 12, wherein the polishing head is configured to tilt.

16. A carrier wafer, comprising:
a body defining a first surface having a center portion and an edge portion and a second surface on an opposite side of the body from the first surface, the first surface defining a substantially convex or concave shape and the second surface being substantially flat, wherein:
the first surface is configured to polish to a substantially flat shape under differential polishing rates between the center portion and the edge portion, and
a total thickness variation between the center portion and the edge portion of the first surface is from 1 μm to 5 μm.

17. The carrier wafer of claim 16, wherein the carrier wafer comprises glass.

18. The carrier wafer of claim 16, wherein the first surface defines a concave shape.

* * * * *